United States Patent
Ohlig

(10) Patent No.: US 6,193,899 B1
(45) Date of Patent: *Feb. 27, 2001

(54) SYSTEM AND METHOD FOR OPTICALLY ALIGNING FILMS AND SUBSTRATES USED IN PRINTED CIRCUIT BOARDS

(76) Inventor: Albert H. Ohlig, 305 Morning Star La., Newport Beach, CA (US) 92660

( * ) Notice: Subject to any disclaimer, the term of this patent is extended or adjusted under 35 U.S.C. 154(b) by 0 days.

This patent is subject to a terminal disclaimer.

(21) Appl. No.: 09/105,056

(22) Filed: Jun. 26, 1998

Related U.S. Application Data

(63) Continuation of application No. 08/814,023, filed on Mar. 10, 1997.

(51) Int. Cl.[7] ............................................. B24B 49/00
(52) U.S. Cl. ............................. 216/85; 216/13; 438/7; 438/16
(58) Field of Search .................. 156/345; 216/13, 216/85; 438/7, 16

(56) References Cited

U.S. PATENT DOCUMENTS

| | | | |
|---|---|---|---|
| 3,207,904 | * | 9/1965 | Heinz .................................. 250/202 |
| 5,604,354 | * | 2/1997 | Lauverjat ............................ 250/548 |

FOREIGN PATENT DOCUMENTS

| | | | |
|---|---|---|---|
| 0298642. | 1/1989 | (EP) | ................................. G03F/9/00 |
| 0298642 | * 1/1989 | (EP) | ................................. G03F/9/00 |
| 0626623 | 11/1994 | (EP) | ................................. G03F/9/00 |
| 2435080 | 3/1980 | (FR) | ................................. G05D/3/10 |
| 58-100853 | 6/1983 | (JP) | ................................. G03F/9/00 |
| 58100853 | * 6/1983 | (JP) | ................................. G05D/3/10 |

* cited by examiner

Primary Examiner—Randy Gulakowski
Assistant Examiner—Shamim Ahmed
(74) Attorney, Agent, or Firm—Fenwick & West LLP

(57) ABSTRACT

System and method provide for optical alignment of an upper film or substrate to a lower film or substrate. The upper film or substrate has an aperture and the lower film or substrate has a set of four apertures. A light is shone on the upper film or substrate at the point above the set of four apertures in the lower film or substrate. A photodetector, which is divided into four quadrants, is positioned beneath the lower film or substrate. Each quadrant of the photodetector detects the amount of light traveling through a different one of the four apertures. The position of the upper film is adjusted until each quadrant detects a substantially equal amount of light. When each quadrant detects a substantially equal amount of light, the aperture in the upper film or substrate is centered over the set of four apertures in the lower film or substrate, and the upper film or substrate is aligned with the lower film or substrate.

24 Claims, 7 Drawing Sheets

SYSTEM AND METHOD FOR OPTICALLY ALIGNING FILMS AND SUBSTRATES USED IN PRINTED CIRCUIT BOARDS

RELATED APPLICATIONS

This is a continuation of co-pending application Ser. No. 08/814,023 filed on Mar. 10, 1997, which is incorporated by reference herein in its entirety.

FIELD OF THE INVENTION

This invention relates generally to the field of flexible or rigid circuit board fabrication and to the field of chemical milling, and, more specifically, to a system and method for optically aligning films and optically aligning substrates to films that are used to fabricate flexible or rigid circuit boards or used as part of a chemical milling process.

BACKGROUND OF THE INVENTION

A circuit on a printed circuit board is created by placing a sheet of film having the circuit design over a copper-clad panel that is coated with photosensitive material. When the film is exposed to light, the photosensitive coating on the panel is chemically altered. After further processing, select portions of the copper on the circuit panel are etched away in accordance with the circuit pattern on the film. This creates a circuit pattern on the panel.

Printed circuit boards often include many layers of circuitry, and each separate circuit requires a different film. It is important that the all the circuits on the printed circuit board be properly aligned. Thus, when the printed circuit board is being created, the films having the circuit designs must be properly aligned. The films are usually aligned two at a time, one film being above the other (though not necessarily touching).

In addition, a film and a substrate may also have to be aligned. Examples of a substrate include a panel used to make a printed circuit board, a metal sheet for chemical milling, or flexible circuit bearing material, such as polyimide. One reason why a substrate and a film may have to be aligned is because the substrate may include holes or layers of circuitry, and the film must be aligned with these features on the substrate.

A film may also need to be aligned with a fixed reference plate, such as a punch press base. A film is aligned to a punch press base for the purpose of punching registration holes.

Registration schemes that align the films to each other or a film to a substrate are known, and one such scheme uses a camera. In the camera scheme, one film or substrate has a black spot on it, and the other film or substrate has a clear spot on it. The clear spot is larger in size than the black spot. The camera, which is placed above or below the film/film layer or film/substrate layer in vertical alignment with the clear spot, views the film or substrate having the black spot while the that film or substrate is moved. The camera produces a video signal, which is sent to a video capture board. The capture board conditions the video signal for readability by a computer, which is attached to the capture board. The computer determines when the clear spot is centered above the black spot, and, when this happens the two films or the film and substrate are properly aligned.

The camera scheme has several disadvantages. First, it is expensive because it requires a camera, lens, illumination, a precise camera mount, a video capture board, a powerful computer, and expensive software. Additionally, the camera scheme also requires a skilled operator because the camera must be properly focused and the light intensity must be properly set. The camera scheme is also slow, as it can take up to several seconds to align the films. Therefore, it is desirable to have a faster, lower cost system that requires minimal operator intervention to align films or substrates.

SUMMARY OF THE INVENTION

The present invention provides a system and method for optically aligning films to films, films to substrates or reference points, and substrates to substrates. The optical alignment system of the present invention includes a light source, an upper film or substrate, a lower film or substrate, and a photodetector. In one embodiment of the present invention, the upper film or substrate has an aperture, and the lower film has a set of four apertures, each of the set of four apertures being smaller than the aperture of the upper film or substrate. The light source is positioned above the upper film or substrate, and the photodetector is positioned below the lower film or substrate. The light source shines light on the upper film or substrate at a point directly above the set of four apertures in the lower film or substrate. In one embodiment, the photodetector is divided into four quadrants, and each quadrant detects the amount of light traveling through a different one of the four apertures. The position of the upper film is adjusted until each quadrant detects a substantially equal amount of light. When each quadrant detects a substantially equal amount of light, the aperture in the upper film or substrate is centered over the set of four apertures in the lower film or substrate, and the upper film or substrate is aligned with the lower film or substrate.

In an alternate embodiment of the present invention the light source is placed below the lower film or substrate, and the photodetector is placed above the upper film or substrate. The number of apertures and the pattern of the apertures in the films and substrates can vary.

The invention described herein may be used to align films and substrates used to make printed circuit boards. There are also other applications for the present invention. These applications include aligning components, such as lead frames, used in the manufacturing of integrated circuits, aligning shadow masks for cathode ray tubes, and aligning close tolerance mechanical parts, such as rotary encoders. The invention described herein could also be used in the graphical arts field to align exposures on printing plates and to register screen print images, such as those used to print CD ROM's or textiles. The present invention may also be used to monitor the relative positions of films and substrates.

DETAILED DESCRIPTION OF THE PREFERRED EMBODIMENT

Figure 1A:
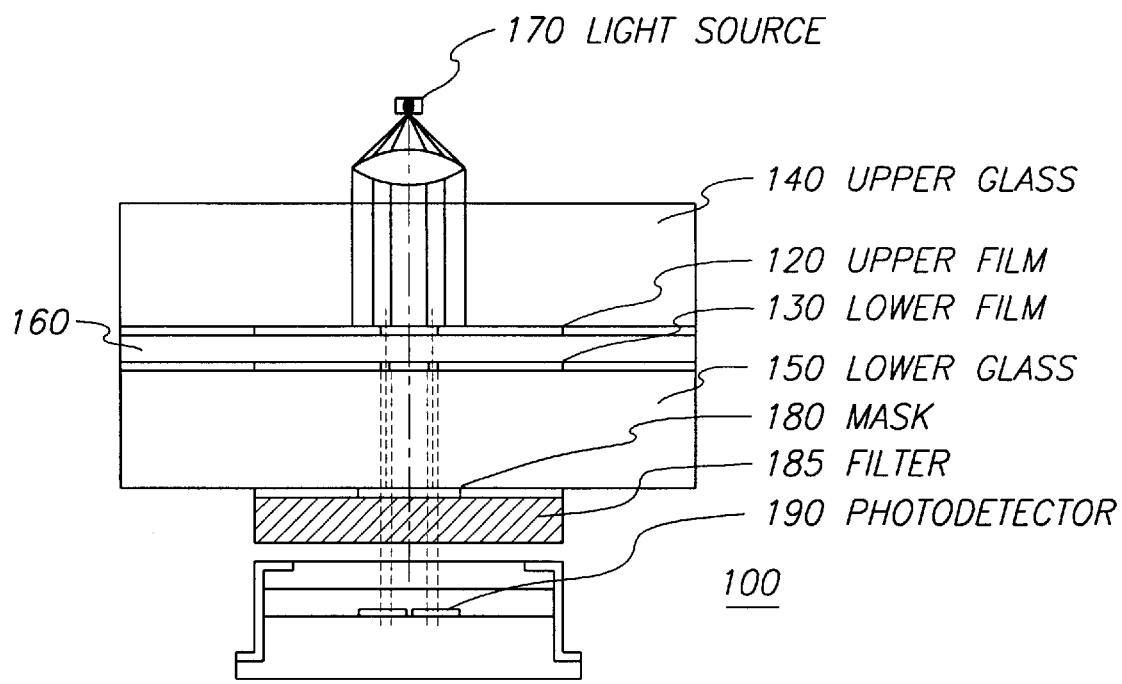
FIG. 1a illustrates a side view of an embodiment of an optical alignment system according to the present invention.

FIG. 1a illustrates a side view of an optical alignment system 100, according to the present invention, for aligning two films. An upper film 120 and a lower film 130 are sandwiched between upper and lower glass platens 140, 150. The upper and lower films 120, 130 can be viewed as each lying in parallel Cartesian planes, each plane defined by a x-axis and a y-axis. In most places, a circuit panel occupies the space 160 between the films 120, 130, but, in one embodiment, air occupies the space 160 at the points at which the films 120, 130 are aligned. In an alternate embodiment, the films 120, 130 are touching. Note that films 120, 130 are not necessarily films per se, but may be another type of master image-bearing sheet, such as piece of glass bearing an image.

A light source 170 is placed above the upper glass platen 140, and a photodetector 190 is placed below the lower glass platen 150. A mask 180, which may be a piece of metal with a hole in it, only allows light from the light source 170 to travel to the photodetector 190 in select areas.

Figure 1B:
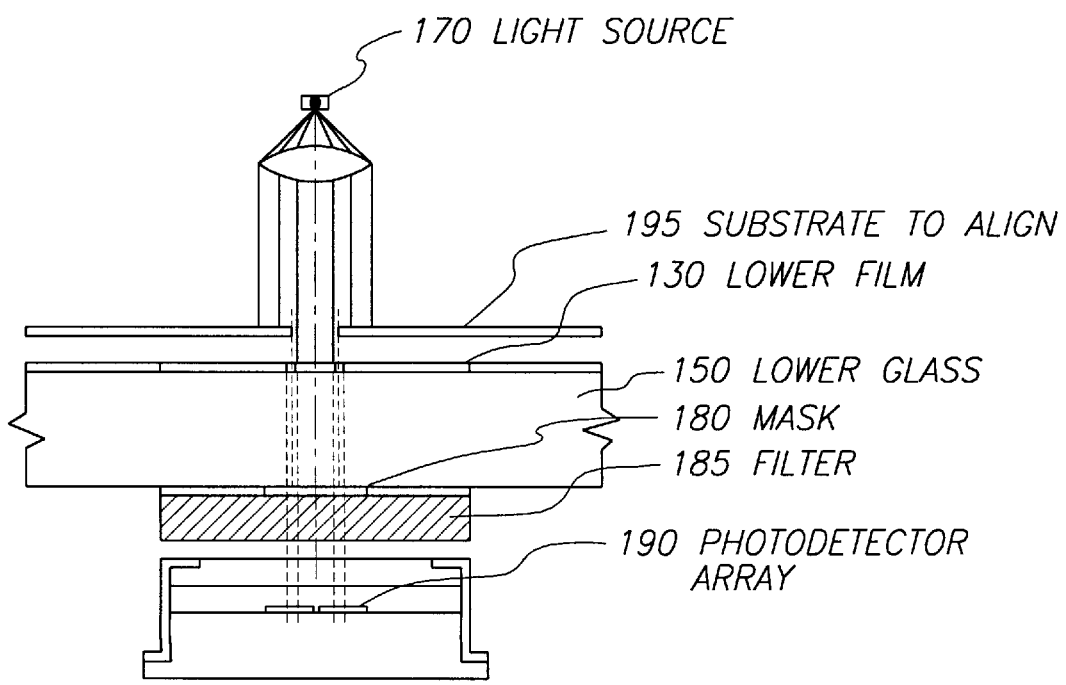
FIG. 1b illustrates a side view of an alternate embodiment of an optical alignment system according to the present invention.

In the chemical milling process a substrate is often sandwiched between to films, where one film is first aligned with the substrate and then the other film is aligned with the substrate. FIG. 1b illustrates a side view of the optical alignment system 100 for aligning a film and a substrate 195. Examples of the substrate 195 include a panel for use in a circuit board, a chemical milled piece of metal, a punched piece of metal to be chemically milled, and flexible circuit bearing material, such as polyimide. Although FIG. 1b illustrate the lower film 130 and the substrate 195, the optical alignment system 100 can be used to align the upper film 120 and the substrate 195. The system and method of the present invention for aligning the upper and lower films 120, 130 and the system and method of the present invention for aligning a film and a substrate 195 are substantially the same. Thus, throughout the remainder of this specification the optical alignment system 100 will be described with respect to aligning upper and lower films 120 and 130, and it should be understood that the optical alignment system 100 can be used to align a film and a substrate by substituting the substrate 195 for either of the upper and lower films 120, 130.

Additionally, the present invention can be used to align two pieces of glass together or to align a film with a fixed reference point, such as punch press base used for punching holes in the film or such as a piece of glass. The system and method for aligning these elements and the system and method for aligning the upper and lower films 120, 130 are substantially the same. Thus, these elements can be substituted for upper and lower films 120, 130.

The optical alignment systems 100 illustrated in FIGS. 1a and 1b can be inverted such that the light source 170 is below the lower film 130 or substrate 195 and the photodetector 190 is above the upper film 120 or substrate 195.

In an alternate embodiment, the light source 170 and the photodetector 190 may be mounted within the upper and lower glass platens 140, 150, respectively. Mounting the light source 170 and the photodetector 190 within the glass platens 140, 150 makes it less likely that stray light will reach the photodetector 190, and such mounting makes the optical alignment system 100 more rugged. Such mounting also makes the optical alignment system 100 more compact, rendering it compatible for more applications.

Both the upper and lower films 120, 130 include "targets." Targets are the places at which the films 120, 130 are aligned. Specifically, the targets of the upper film and the targets of the lower film are centered over each other to align the upper and lower films.

Figure 2A:
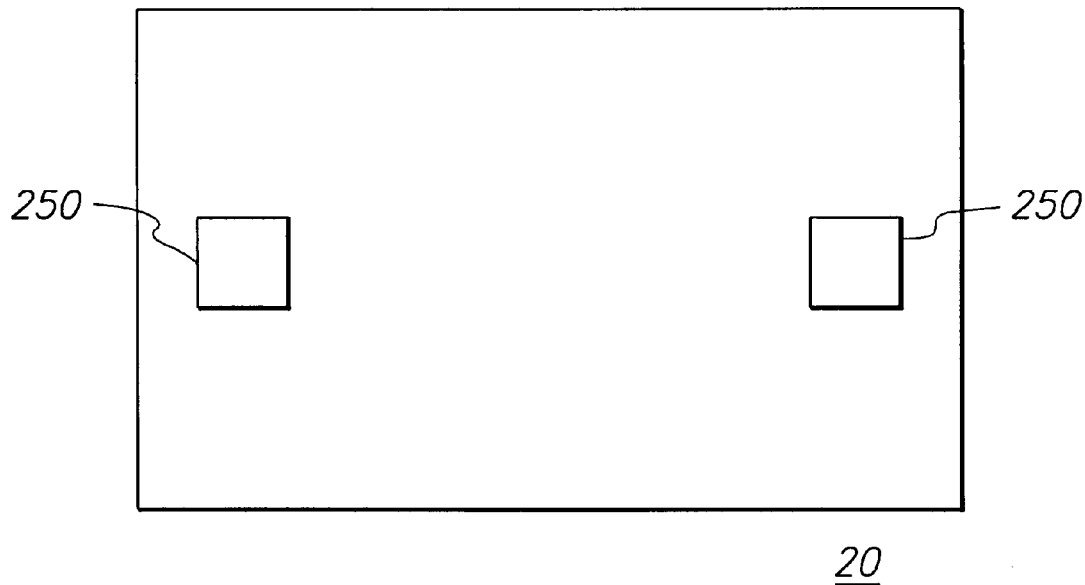
FIG. 2a illustrates a planar view of an upper film used in an embodiment of the optical alignment system.

FIG. 2a illustrates a planar view of the upper film 120. The targets in the upper film 120 are apertures 250. Although the apertures 250 shown in FIG. 2a are square, they could be other shapes, such as rectangular, circular, or pie shaped. In one embodiment, the area of the aperture 250 is approximately 1.6 square millimeters (the length of each side of the square is 50 mils).

Figure 2B:
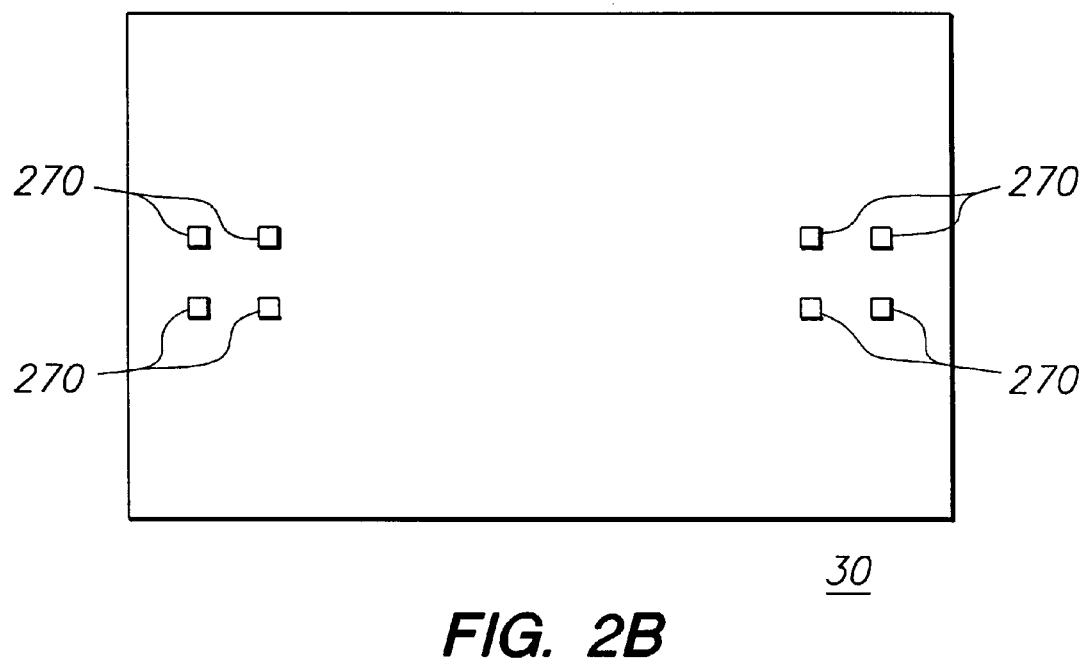
FIG. 2b illustrates a planar view of a lower film used in an embodiment of the optical alignment system.

FIG. 2b illustrates a planar view of the lower film 130. The targets in the lower film 130 are the two sets of four apertures 270. In one embodiment, each of the apertures 270 in the lower film 130 have an area of approximately 0.016 square millimeters (the length of each side of the square is 5 mils). If the aperture 250 in the upper film 120 is directly centered over a set of the apertures 270 in the lower film 130 and if the area of the aperture 250 is 1.6 square millimeters, then 0.004 square millimeters of each of the set of apertures 270 (2.5 mils on each side) will be directly beneath the aperture 250 in the upper film 120. The apertures 270 shown if FIG. 2b are square, but they could be another shape, such as rectangular, circular, or pie shaped. Additionally, aperture 250 could be placed in the lower film 130, and apertures 270 could be placed in the upper film 120.

Although FIGS. 2a and 2b illustrate only two targets on each of the films, more targets could be used. The more targets that are used, the more precise the alignment between the upper and lower films are likely to be. Additionally, it is not always possible to align the films perfectly both lengthwise and widthwise, and, if two or more targets are used, the best average position is taken.

Figure 7:
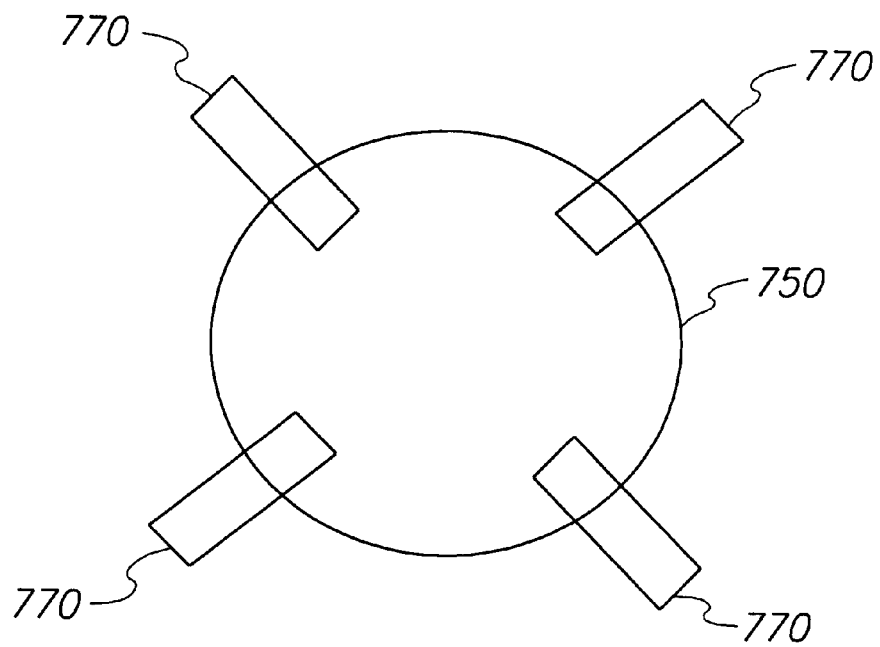
FIG. 7 illustrates an alternate pattern of apertures for the lower and upper films.

Note that the number of apertures in a target and the pattern in which the apertures are arranged may vary. FIG. 7 illustrates one such variation in which the upper film has aperture 750 and the lower film has apertures 770. This variation is especially applicable when the optical alignment system 100 is used to align a film to a panel having a hole in it. In this case, the hole in the panel is aperture 750, and the film has apertures 770.

For each target 250 in the upper film 120, there is a corresponding target 270 in the lower film 130. These two targets will be referred to as a set of targets. For each set of targets, there is a light source 170 and a photodetector 190 arranged as shown in FIG. 1. For each set of targets, there may also be a mask 180 and an optical filter 185, such as an optical bandpass filter corresponding to the wavelength of the light emitted by the light source 170. The optical filter 185 filters out stray radiation that might be detected by the photodetector 190. The type of optical filter 185 used depends on the type of light source 170. For instance, if the light source 170 is a visible laser, a conventional red filter is used. If the light source 170 is an infrared diode, a conventional infrared filter is used.

For each set of targets that is to be aligned, light from the light source corresponding to that set is shone upon the upper film 120. The light travels through the target in the upper film 120 and through any portion of the target in the lower film 130 that is directly below the target in the upper film 120. Light that travels through both targets is detected by the photodetector 190 below the targets. The mask 180 prevents extraneous light from reaching the photodetector 190. As will be discussed below, the amount of light detected by the photodetector 190 determines whether the targets are properly aligned.

The light source 170 may be a conventional laser, laser diode, infrared diode, compact LED, small incandescent light, or fiber optical light. In one embodiment, the light from the light source 170 is collimated. Using collimated light reduces the likelihood that the light will be inclined as it travels through the upper film 120. Such inclination can cause the upper and lower films 120, 130 to be misaligned.

Figure 3:
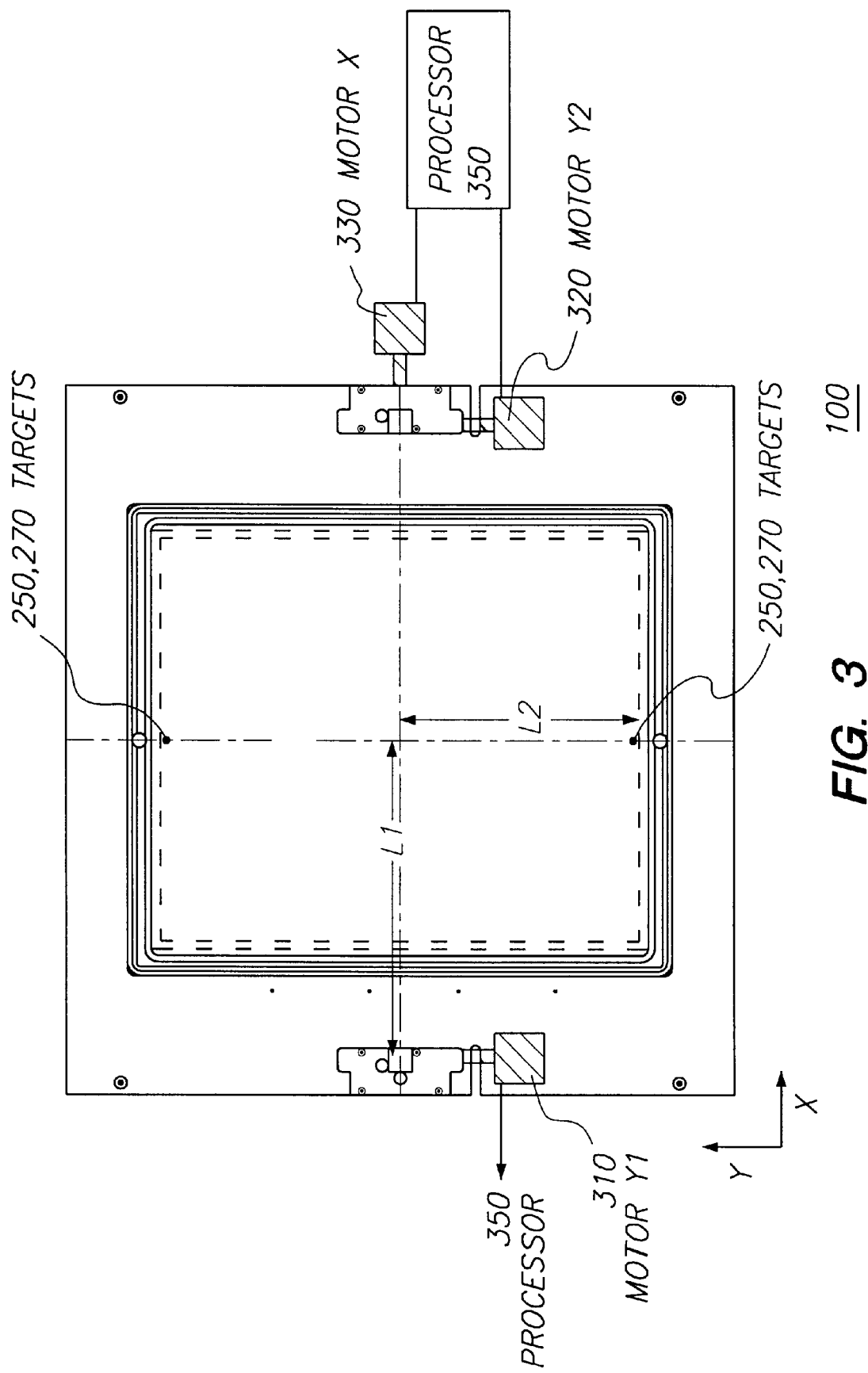
FIG. 3 illustrates a planar view of the optical alignment system according to one embodiment of the present invention.

Referring now to the planar view of FIG. 3, the optical alignment system 100 includes motors 310, 320, and 330. If the films 120, 130 are out of alignment, the motors 310, 320, and 330 move the upper film 120 until it is in correct position with respect to the lower film 130. Motors 310, 320, 330 maybe stepper motors or motorized micrometers. Motor 330 moves the upper film in the x-direction. Motor 310 moves one side of the upper film 120 in the y direction, and motor 320 moves the other side of the upper film 120 in the y direction. Two y-direction motors 320, 310 are used so that the upper film 120 may be easily rotated.

In an alternate embodiment, motors 310, 320, 330 are not used, and the films are aligned manually.

Figure 4:
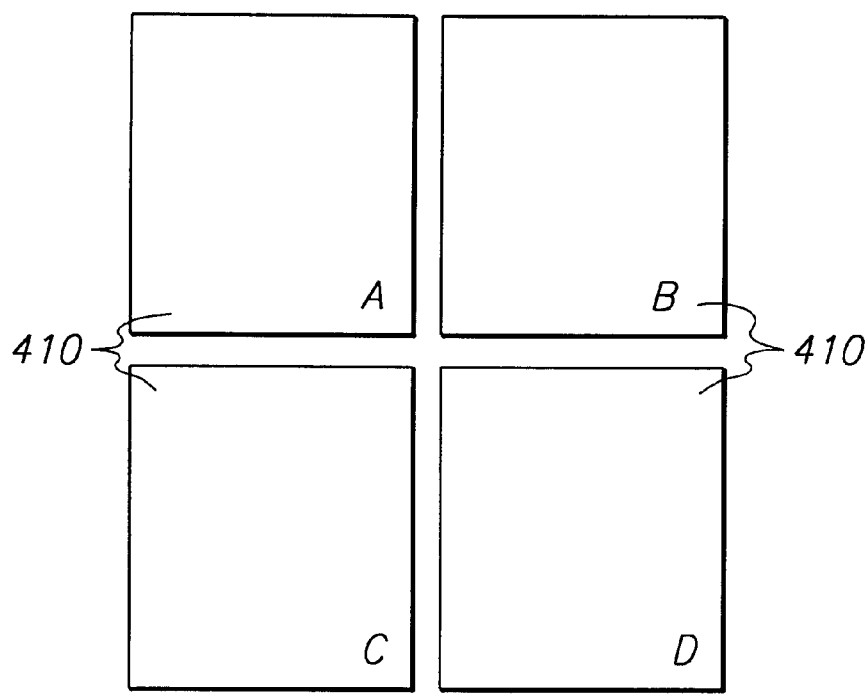
FIG. 4 illustrates a photodetector used in an embodiment of the optical alignment system.

The photodetector 190 includes at least three photosensitive surfaces. Referring now to FIG. 4, the photodetector 190 may be a conventional quadrant detector 400 having four separate photodetectors 410, such as photodiodes. A quadrant detector 400 is traditionally used to track the position of a single beam of light. Specifically, by comparing the signal received from each of the four separate photodetectors 410, the position of the beam relative to the center of the quadrant detector 400 can be determined. Using the quadrant detector 400 in the a conventional fashion is costly and impractical for the present invention because the goal of the conventional use is to align the light beam with the quadrant detector, whereas a goal of the present invention is align the upper film 120 with the lower film 130.

In one embodiment of the present invention, several, individual beams of light are imaged on the quadrant detector 400. The number of beams imaged depends on the number of apertures 270 in the lower film 130. The operation of the present invention will be discussed assuming the lower film 130 displayed in FIG. 2b is used, but a lower film 120 with a different number of apertures 270 could be used. If the lower film 130 displayed in FIG. 2b is employed, then the quadrant detector 400 will detect up to four beams of light, one in each quadrant.

When the aperture in the upper film 120 is exactly centered over the apertures in the lower film 130, the films 120, 130 are in correct alignment and equal amounts of light from the light source will pass through each of the apertures 270 in the lower film 130.

Figure 5A:
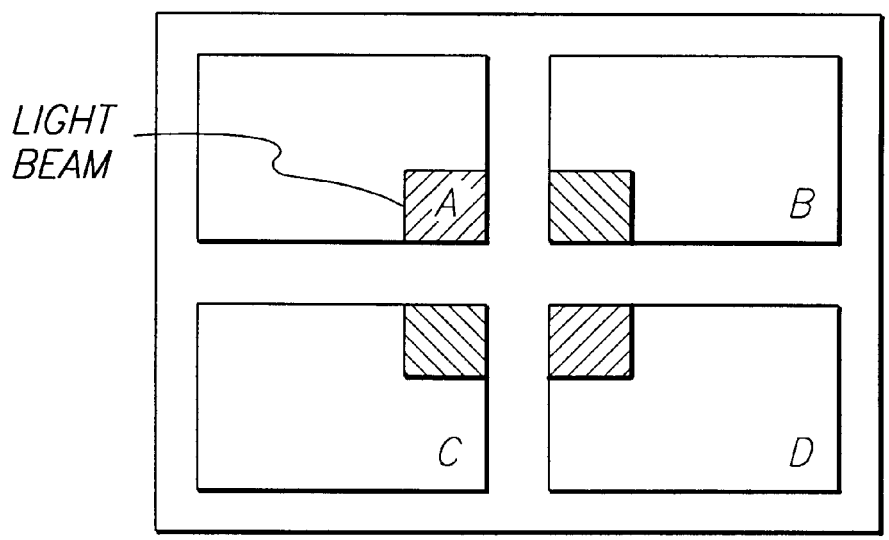
FIGS. 5a–5e illustrate the amount of light the photodetector receives, depending on the position of the upper film.
Figure 5B:
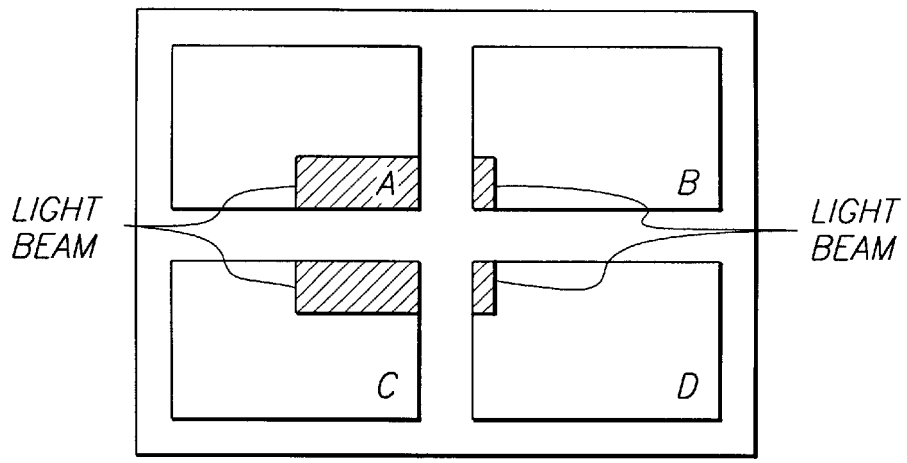
Figure 5C:
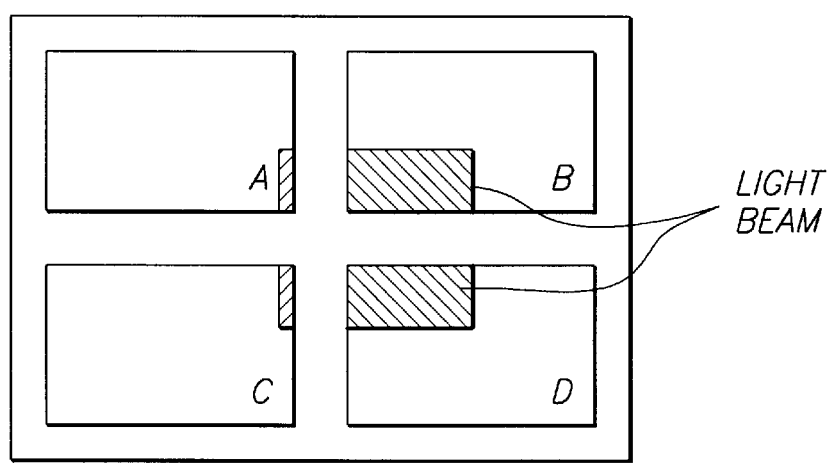
Figure 5D:
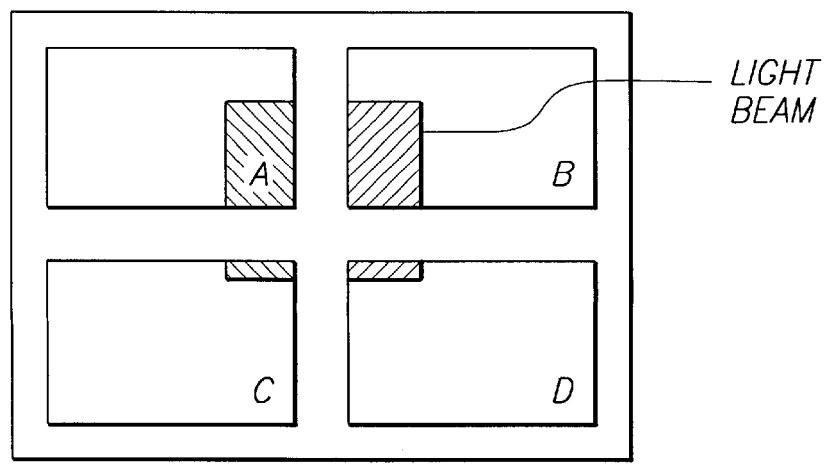
Figure 5E:
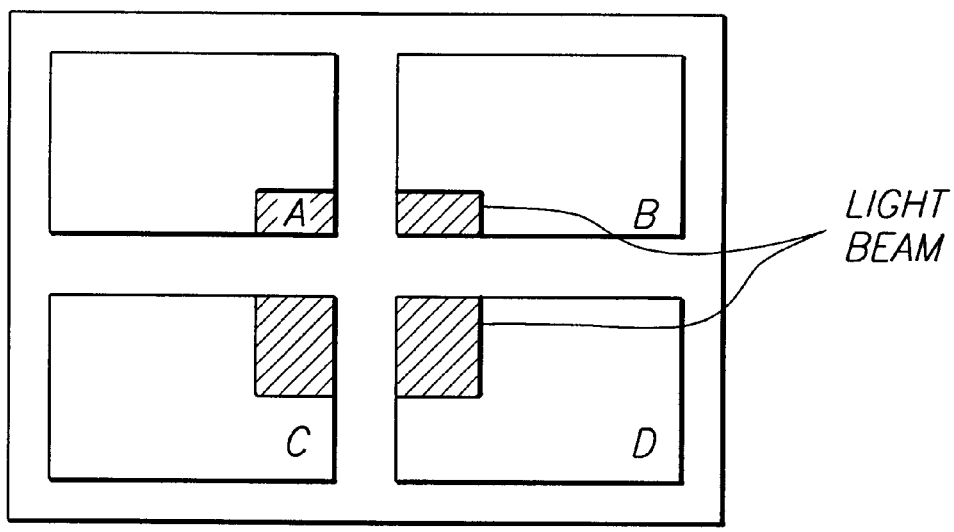

FIGS. 5a–5e illustrate the amount of light the quadrant detector 400 receives, depending on the position of the upper film 120. The four quadrants of the quadrant detector 400 are labeled A, B, C, and D, each quadrant having one photodetector 410. In FIG. 5a, equal amounts of light are detected by each of the photodetectors 410, thus indicating that the upper and lower films 120, 130 are correctly aligned. In FIG. 5b, quadrants A and C receive more light then quadrants B and D, which indicates that the upper film 120 is positioned too much to the left in the x-direction with respect to the lower film 130. Conversely, in FIG. 5c, quadrants B and D receive more light than quadrants A and C, and, in this case the upper film 120 is positioned too far over to the right in the x direction with respect to the lower film 130. In FIG. 5d, quadrants A and B receive more light than quadrants C and D, which means that, with respect to lower film 130, the upper film 120 has moved too far up in the y-direction. In FIG. 5e, quadrants C and D receive more light than quadrants A and B, indicating that, with respect to the lower film 130, the upper film 120 has moved too far down in the y-direction.

Upon detecting light, each photodetector 410 in each quadrant generates an electrical signal proportional to the amount of light detected. The signal generated by each photodetector 410 is used to determine the relative "x" and "y" positions of each set of targets. These positions can be determined with the following formulas:

$X=(A+C)/(B+D)$ $Y=(A+B)/(C+D)$

The values A, B, C, and D are the amount of voltage generated by the photodetectors 410 in the respective quadrants A, B, C and D.

In one embodiment, the light from the light source 170 is pulsed or modulated. This increases the signal to noise ratio, which increases the accuracy of the quadrant detector 400. Additionally, by comparing a pulse with an idle state, it is easier to distinguish the desired signal from any stray radiation, component drift, or electronic offset. Pulsing the light also allows for greater light intensity with the same or lower average power dissipation in the light source 170.

In the optical alignment system 100 displayed in FIG. 3, if one line were to be drawn between the targets 250, 270 and if another line were to be drawn between the motors 310, 320, and 330, the two lines would be perpendicular to each other. In this case, the amount each motor must move the upper film 120 to align the upper and lower films 120, 130 is calculated as follows:

Motor X=Average of all "X" values for each set of targets. For the optical alignment system illustrated in FIG. 3, Motor X=(X1+X2)/2, , where X1 is the X value for one set of targets and X2 is the X value for the other set of targets.

Motor Y1=(Average of all "Y" values for each set of targets)−(Rotational Error*aspect ratio between the detectors and the motors)

Motor Y2=(Average of all "Y" values for each set of targets)+(Rotational Error*aspect ratio between the detectors and the motors)

Rotational error=The measure of correction that needs to be applied as a result of a rotation of one film relative to the other. In the optical alignment system 100 illustrated in FIG. 3, the rotational error is the difference between the "X" values of the two sets of targets 250, 270 divided by 2. In other words, the rotational error=((X1−X2)/2).

Aspect ratio=The gain required to compensate for the rotational error. In the optical alignment system 100 illustrated in FIG. 3, the gain is L2/L1, where L2 and L1 are illustrated in FIG. 3.

Figure 6:
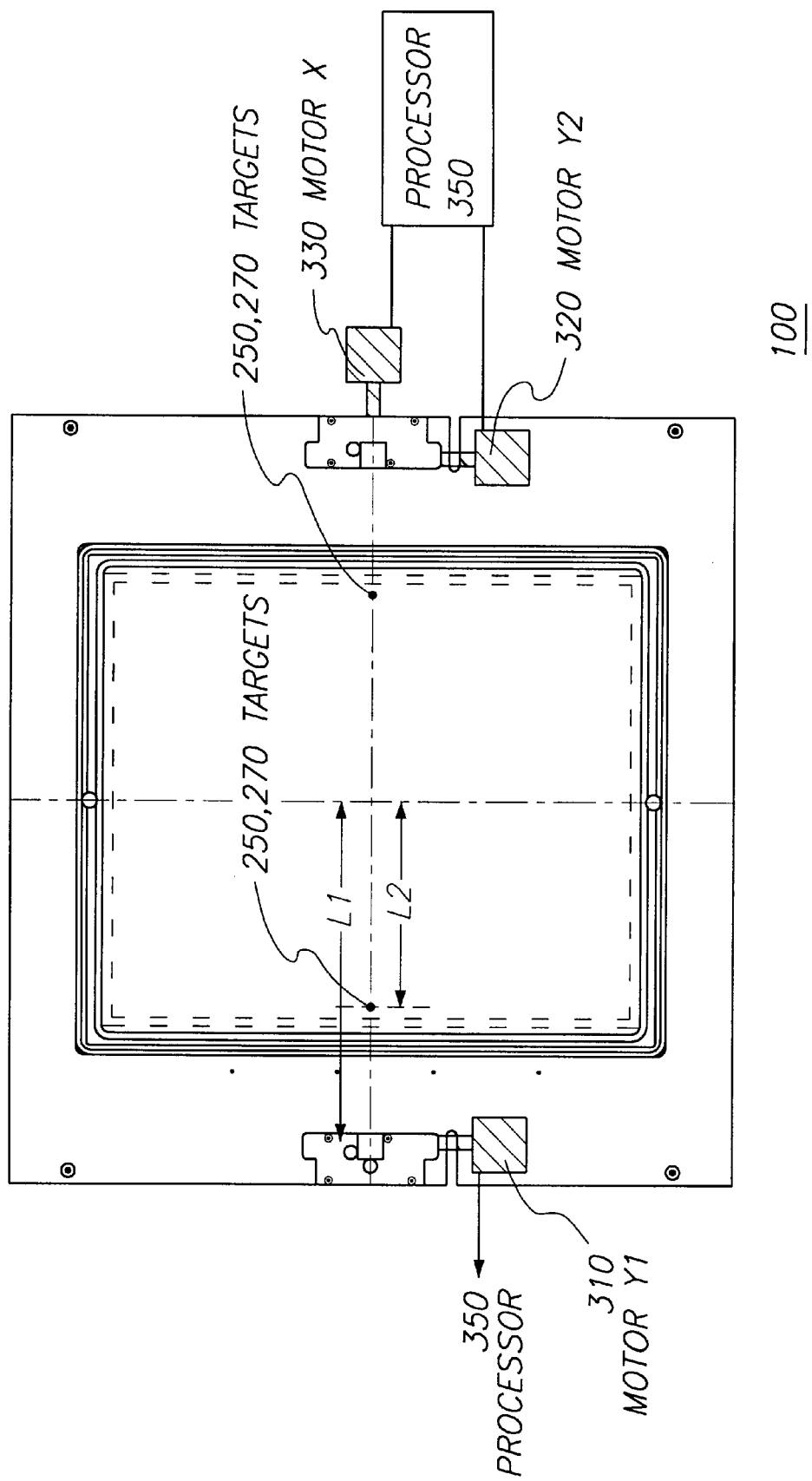
FIG. 6 illustrates a planar view of the optical alignment system according to an alternate embodiment of the optical alignment system.

In an alternate embodiment, as illustrated in FIG. 6, the targets 250, 270 may lie between the motors 310, 320, 330. In this case, the amount each motor must move the upper film 120 to
align the upper and lower films 120, 130 is calculated as follows:

Motor X=Average of all "X" values for each set of targets. For the optical alignment system illustrated in FIG. 6, this is (X1+X2)/2

Motor Y1=(Average of all "Y" values for each set of targets)+(Rotational Error*aspect ratio between the detectors and the motors)

Motor Y2=(Average of all "Y" values for each set of targets)−(Rotational Error*aspect ratio between the detectors and the motors)

Rotational error=The measure of correction that needs to be applied as a result of a rotation of one film relative to the other. In the optical alignment system 100 illustrated in FIG. 6, the rotational error is the difference between the "Y" values of the two sets of targets 250, 270 divided by 2. In other words, the rotational error=((Y1−Y2)/2), where Y1 is the Y value for one set of targets and Y2 is the Y value for the other set of targets.

Aspect ratio=The gain required to compensate for the rotational error. In the optical alignment system 100 illustrated in FIG. 6, the gain is L1/L2, where L2 and L1 are illustrated in FIG. 6.

The values Motor X, Motor Y1 and Motor Y2 are signal values (i.e. voltage or current) which are fed into a processor 350, such as a programmable logic controller, a microprocessor, or a conventional digital computer. Based on the received signal values, the processor 350 controls the amount motors 310, 320, and 330 move the upper film.

In an alternate embodiment the processor 350 is an analog circuit, which performs real time calculations, and is faster and cheaper than a digital computer.

The light from the light source 170 is not always uniform. Therefore, to improve accuracy the processor 350 can be biased or calibrated, using analog or digital calibration methods, to account for the error margin caused by non-uniform light. The analog calibration method can be accomplished by using a potentiometer that adjusts the signals generated by the photodetectors 410 to compensate for the non-uniformity of the light.

With the digital calibration method, the processor 350 scales or nulls the values of the signals generated by the photodetectors to compensate for the non-uniformity of the light. In one embodiment, the values used to scale or null the photodetector signals are generated by shining light on the lower film 130 at various locations. A table of relative light intensity values detected is then generated, where the rows values correspond to the x position of the light source 170 and the column values correspond to the y-position of the light source 170. The relative light intensity values are correction factors, and when the processor 350 scales or nulls the values of the signals generated by the photodetectors 410, it multiplies the correction factor corresponding to the appropriate position of the light source 170 by the values generated by the photodetectors 410.

What is claimed is:

1. A method for aligning a first layer of material having a target and a second layer of material having a target, the target in the first layer of material and the target in the second layer of material comprising a set of targets, at least a portion of the second layer of material positioned parallel to the first layer of material, the method comprising the steps of:
    (a) directing electromagnetic radiation toward the target in the first layer of material;
    (b) detecting the intensity of the electromagnetic radiation traveling from the target in the first layer of material and through the target in the second layer of material, wherein the intensity of the electromagnetic radiation detected through the set of targets provides information regarding alignment of the first layer of material and the second layer of material along both X and Y directions;
    (c) determining a relative position of the first layer and the second layer with respect to each other by examining the intensity of electromagnetic radiation detected through the set of targets; and
    (d) in response to determining that the first layer and the second layer are not aligned properly, shifting the position of the first layer, and repeating steps (a) through (d) until the first layer and the second layer are aligned properly.

2. The method of claim 1, wherein the electromagnetic radiation is provided by a light.

3. The method of claim 1, wherein the directing step includes directing collimated light toward the target in the first layer of material.

4. The method of claim 1, wherein the directing step includes directing a laser beam at the target in the first layer of material.

5. The method of claim 1, wherein the first layer of material is a film.

6. The method of claim 1, wherein the second layer of material is a film.

7. The method of claim 1, wherein the first layer of material is a substrate.

8. The method of claim 1, wherein the second layer of material is a substrate.

9. The method of claim 1, wherein the first layer of material is a circuit panel.

10. The method of claim 1, wherein the second layer of material is a circuit panel.

11. The method of claim 1, wherein the detecting step includes detecting the intensity of electromagnetic radiation traveling from an aperture defined by the target in the first layer of material and traveling through at least one aperture defined by the target in the second layer of material.

12. A method for aligning a first layer of material having at least one aperture and a second layer of material having a plurality of apertures, the one aperture in the first layer and the plurality of apertures in the second layer of material comprising a set of targets, at least a portion of the second layer of material oriented in parallel with respect to the first layer of material, the method comprising:
    (a) directing electromagnetic radiation towards the at least one aperture in the first layer of material;
    (b) for each of the plurality of apertures in the second layer of material, detecting the intensity of the electromagnetic radiation passing from the at least one aperture in the first layer of material and through each of the plurality of apertures in the second layer of material, wherein the intensity of the electromagnetic radiation detected through the set of targets provides information regarding alignment of the first layer of material and the second layer of material along both X and Y directions;
    (c) determining whether the intensity of electromagnetic radiation passing through each of the plurality of apertures in the second layer of material is substantially the same; and
    (d) in response to the intensity of electromagnetic radiation passing through each of the plurality of apertures in the second layer of material not being substantially the same, shifting the position of at least one of the first and second layers of material in a direction determined by examining the intensity of the electromagnetic radiation, and repeating steps (a) through (d) until the intensity of electromagnetic radiation passing through each of the plurality of apertures in the second layer of material is substantially the same.

13. The method of claim 12, wherein the determining step includes comparing each of the intensities detected in the detecting step with each of the other intensities detected in the detecting step.

14. The method of claim 13, wherein the comparison is calibrated to account for non-uniform electromagnetic radiation.

15. The method of claim 12, wherein the determining step is calibrated to account for non-uniform electromagnetic radiation.

16. The method of claim 12, wherein the electromagnetic radiation is provided by a light.

17. The method of claim 12, wherein the directing step includes directing collimated light toward the aperture in the first layer of material.

18. The method of claim 12, the directing step includes directing a laser beam at the target in the first layer of material.

19. The method of claim 12, wherein the first layer of material is a film.

20. The method of claim 12, wherein the second layer of material is a film.

21. The method of claim 12, wherein the first layer of material is a substrate.

22. The method of claim 12, wherein the second layer of material is a substrate.

23. The method of claim 12, wherein the first layer of material is a circuit panel.

24. The method of claim 12, wherein the second layer of material is a circuit panel.

* * * * *